United States Patent [19]

Sakamoto

[11] 3,879,747

[45] Apr. 22, 1975

[54] REMOTE CONTROL DEVICE

[75] Inventor: Yoichi Sakamoto, Toyonaka, Japan

[73] Assignee: Matsushita Electric Industrial Co., Ltd., Osaka, Japan

[22] Filed: Aug. 29, 1972

[21] Appl. No.: 284,556

Related U.S. Application Data

[63] Continuation-in-part of Ser. No. 194,998, Nov. 2, 1971.

[30] Foreign Application Priority Data

Dec. 4, 1968 Japan ................................ 43-88865

[52] U.S. Cl. .................... 358/1; 325/392; 325/465; 334/15

[51] Int. Cl. ............................................. H04b 1/26

[58] Field of Search .......... 178/DIG. 15; 235/92 PE, 235/92 ME; 340/347 DA; 325/392, 390–395, 464–465; 179/1 SS, 1 GQ, 1 D, 1 SW

[56] References Cited

UNITED STATES PATENTS

| | | | |
|---|---|---|---|
| 2,817,025 | 12/1957 | Adler | 178/DIG. 15 |
| 3,070,788 | 12/1962 | Tompkins | 340/347 DA |
| 3,207,847 | 9/1965 | Epstein | 179/1 SW |
| 3,218,558 | 11/1965 | Kieffer | 179/1 SS |
| 3,375,329 | 3/1968 | Prouty | 179/1 GQ |
| 3,452,258 | 6/1969 | Thompson | 340/347 DA |
| 3,505,673 | 4/1970 | James | 340/347 DA |
| 3,528,544 | 9/1970 | Noguchi et al. | 235/92 ME |
| 3,537,012 | 10/1970 | Reichard et al. | 325/392 |
| 3,564,217 | 2/1971 | Bounsall | 235/92 ME |
| 3,602,822 | 8/1971 | Evans et al. | 325/464 |
| 3,654,557 | 4/1972 | Sakamoto et al. | 325/465 |
| 3,702,901 | 11/1972 | Cherry | 179/1 D |

OTHER PUBLICATIONS

Radio Electronics, Dec., 1958, p. 61.

*Primary Examiner*—Benedict V. Safourek
*Attorney, Agent, or Firm*—Stevens, Davis, Miller & Mosher

[57] ABSTRACT

The outputs of a reversible binary counter are applied to the binary terminals of a binary to *n* output decoder and one of the *n* terminals of the decoder corresponding to the outputs of the counter is selected. Desired control signals are obtained from electrical circuits connected with the selected terminal. Also the reversible binary counter may be remotely controlled.

7 Claims, 10 Drawing Figures

REMOTE CONTROL DEVICE

CROSS-REFERENCE TO RELATED APPLICATION

This is a continuation-in-part application of a streamlined continuation application U.S. Ser. No. 194,998 filed Nov. 2, 1971.

BACKGROUND OF THE INVENTION

1. Field of the Invention

This invention relates to a device which can remotely control the volume of sound of a television receiver, the channel change-over etc.

2. Description of the Prior Art

In the conventional remote control of sound of a television receiver, for example, an electric motor is used to adjust a variable resistor for volume control. With such construction, however, the mechanical parts tend to be worn away. This will deteriorate the durability of the system and ultimately lead to faults.

SUMMARY OF THE INVENTION

One object of the present invention is to provide a remote control device which can operate electronically without any resort to mechanical parts.

Another object of the present invention is to provide a remote control device which can immediately set the device to be controlled into the standard adjusted condition.

An additional object of the present invention is to provide a remote control device which can be used for the adjustment of hue, chromatic saturation, and sound in a color television receiver or for the adjustment of two channel or four channel stereophonic systems.

DESCRIPTION OF THE PREFERRED EMBODIMENTS

Figure 1:
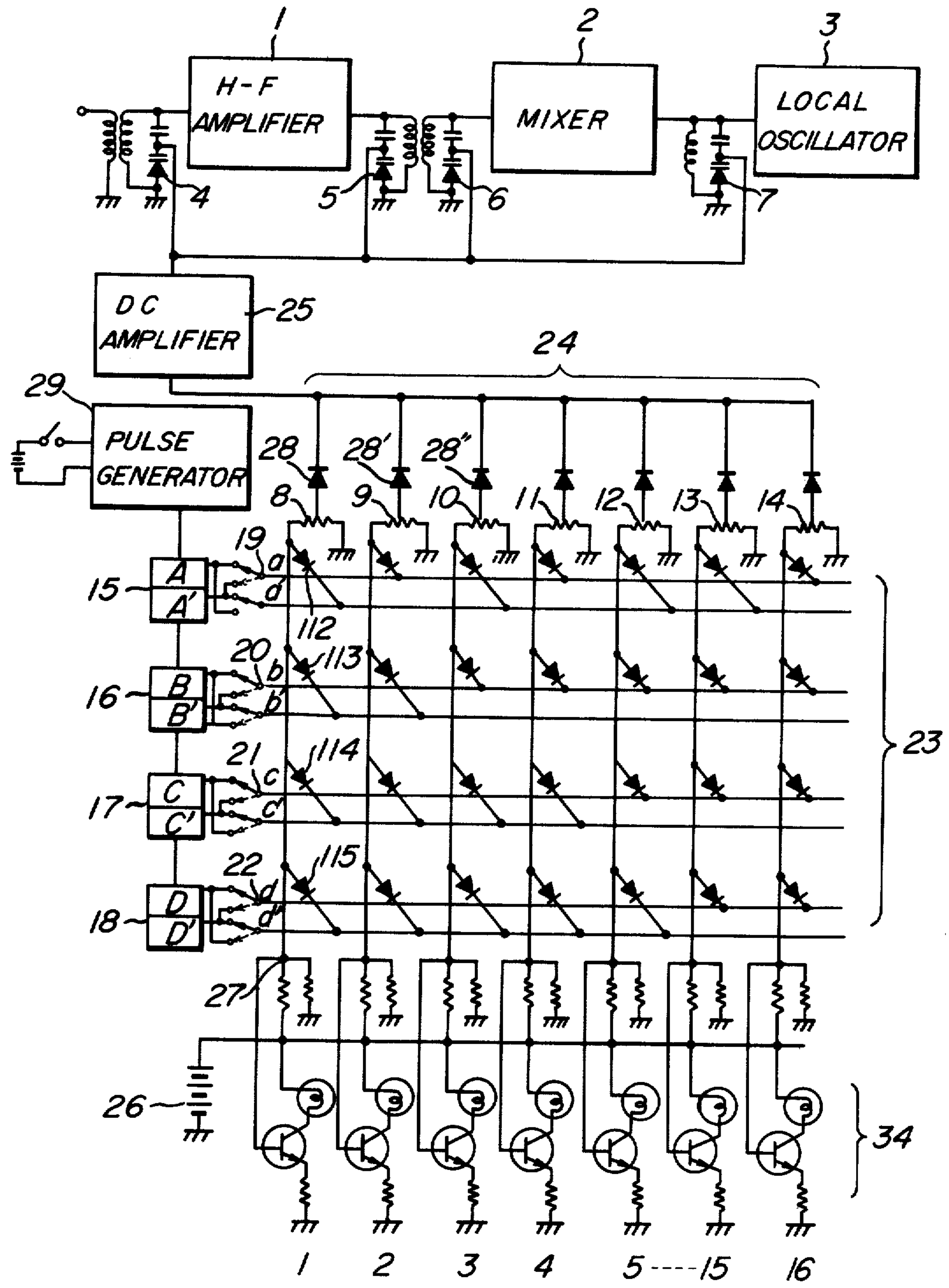
FIG. 1 is a circuit diagram of a remote control device as an embodiment of the present invention.

In FIG. 1, reference numeral 1 indicates an h-f amplifier, 2 a mixer, 3 a local oscillator, 4 a variable capacitance diode for tuning an output signal, 5 and 6 interstage tuning variable capacitance diodes, and 7 a variable capacitance diode for local oscillation. Resistors 8 to 14 divide a power voltage so as to establish predetermined voltages to be impressed on the diodes 4, 5, 6 and 7 for respective channels. Binary elements 15, 16, 17 and 18 are typically flip-flops which can store binary-coded information. Switches 19, 20, 21 and 22 all have the same function. For example, the switch 19 connects the rows *a* and *a'* of a diode matrix with either the outputs of the flip-flops A and A' or those of the flip-flops A' and A, respectively. It is assumed that state "0" is the case where voltages of 0V and +9V (for example) are respectively applied to the rows *a* and *a'* and that state "1" is defined where voltages of 0V and +9V are respectively applied to the rows *a'* and *a*. The outputs of the flip-flops 15 to 18 can drive every raw of the matrix into the state "1" or "0." If the switches 19 to 22 have their positions shown by solid line in FIG. 1, the outputs of the flip-flops A, A', B, B', C, C', D and D' are applied to the rows *a, a', b, b', c, c', d* and *d'*, respectively, so that each row of the matrix assumes "0" or "1" state. Therefore, by the appropriate combination of the "0" and "1" states, binary codes corresponding to desired channels can be produced, as seen in Table 1 given below.

Table 1

| | | | | | | | |
|---|---|---|---|---|---|---|---|
| *a*, *a'* | 0 | 1 | 0 | 1 | 0 | 0 | 1 |
| *b*, *b'* | 0 | 0 | 1 | 1 | 1 | 1 | 1 |
| *c*, *c'* | 0 | 0 | 0 | 0 | 1 | 1 | 1 |
| *d*, *d'* | 0 | 0 | 0 | 0 | 0 | 1 | 1 |
| Channel Number | 1 | 2 | 3 | 4 | 5 | 15 | 16 |

Figure 2:
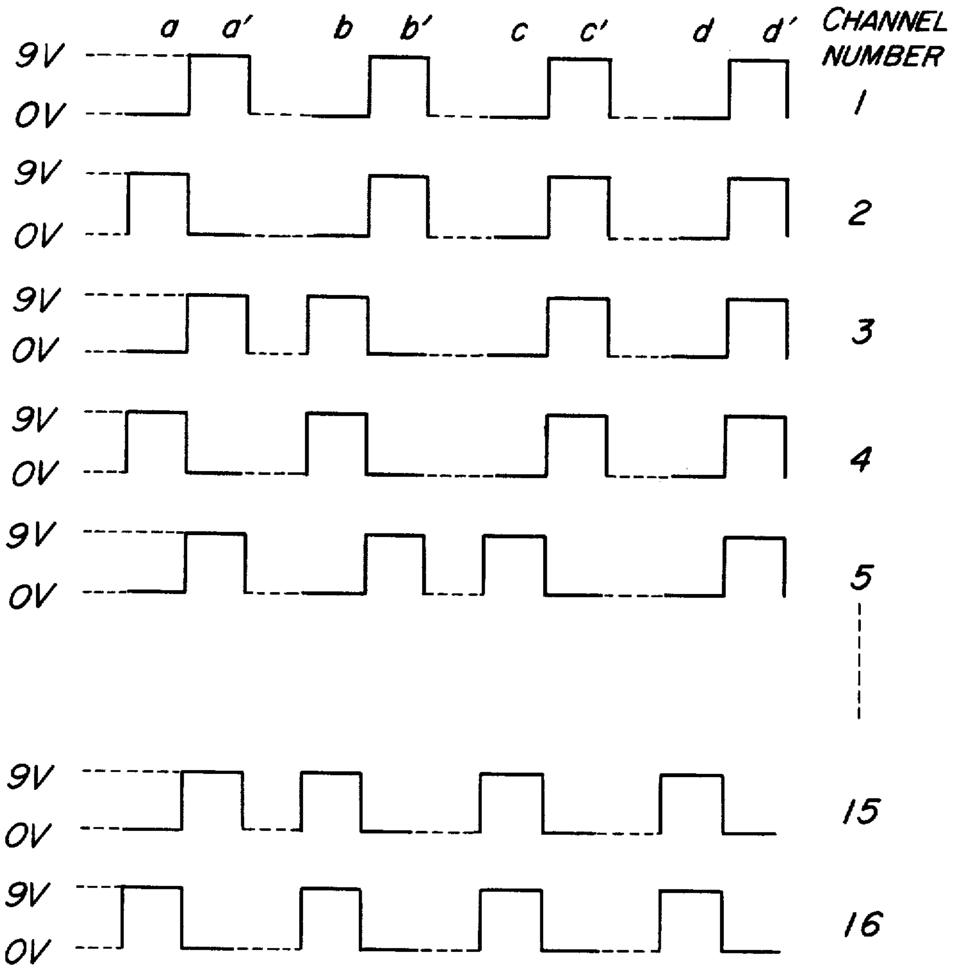
FIGS. 2 and 3 show waveforms necessary for the explanation of the operation of the remote control device shown in FIG. 1.

Namely, a fixed voltage of, for example, 6V is applied to the anodes of the diodes connected with the rows of the matrix corresponding to the binary code selected by the matrix, while the anodes of the other diodes are grounded. And moreover, by means of a group of diodes 24 connected with columns of the diode matrix is selected only the preset voltage corresponding to the channel having the voltage of 6V, and the selected preset voltage is amplified through a dc amplifier 25 so that the variable capacitance diodes 4 to 7 are supplied with a voltage to select a desired channel. Now, for the sake of better understanding, description will be made through an example. The case is first considered where channel No. 1 is selected. It is known from the Table 1 that the binary code indicative of channel No. 1 is 0000. Then, the voltage having the waveform corresponding to the channel No. 1 shown in FIG. 2 is applied to the rows *a, a'; b, b'; c, c'*; and *d, d'*. Therefore, all the diodes connected with the column corresponding to the channel No. 1 are all cut off. In this case, it is assumed that the voltage at the point 27, which is obtained by dividing the power voltage 26 with a resistor, is 6V. Voltages applied to the diodes other than those connected with the column for channel No. 1 are all zero, voltage developed across the diode due to their forward resistance being neglected. Accordingly, only the diode 28 of the group 28 becomes conductive so that only the preset voltage indicative of channel No. 1 is fed through the diode 28 to the dc amplifier 25. If the binary code 1000 indicative of channel No. 2 is produced, the diode 28' turns conductive. In like manner, the diode 28'' is turned on in response to the binary code 0100 for channel No. 3. Accordingly, the channels 2 and 3 are selected, respectively.

The flip-flops 15 to 18 are designed to count pulses from a pulse generator 29 and store binary codes. The switch which controls the pulse generator is placed at a remote position.

The above description is for the case where the channels are changed over from No. 1 to No. 16, i.e. in the forward direction. However, the channels are changed over in the reverse direction when the following artifice is followed.

Figure 3:
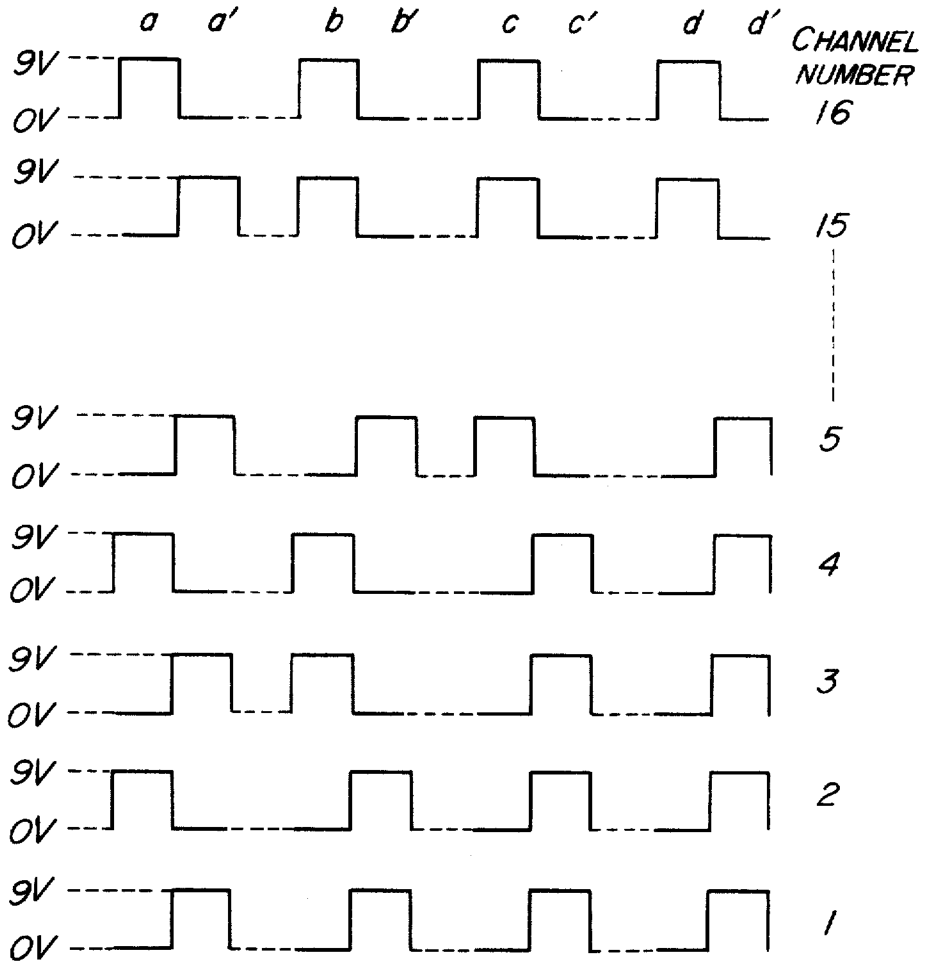

Namely, if the switches 19 to 22 come into the position indicated by dotted line in FIG. 1, voltage having waveforms shown in FIG. 3 are applied to the rows of the matrix *a*, *a'*; *b*, *b'*; *c*, *c'*; and *d*, *d'*. Table 2 given below shows the voltages in terms of binary codes.

Table 2

| | | | | | | | | | |
|---|---|---|---|---|---|---|---|---|---|
| *a*, *a'* | 1 | 0 | | 0 | 1 | 0 | 1 | 0 | |
| *b*, *b'* | 1 | 1 | | 1 | 1 | 1 | 0 | 0 | |
| *c*, *c'* | 1 | 1 | | 1 | 0 | 0 | 0 | 0 | |
| *d*, *d'* | 1 | 1 | | 0 | 0 | 0 | 0 | 0 | |
| | 16 | 15 | | 5 | 4 | 3 | 2 | 1 | Channel ammber |

Therefore, channels 16, 15, 14, ....., 2, 1 are selected sequentially in this order, since the order of the operation of the flip-flops 15, 16, 17 and 18, i.e., binary counters, is the same as according to Table 1 and the waveforms shown in FIG. 2.

Figure 4:
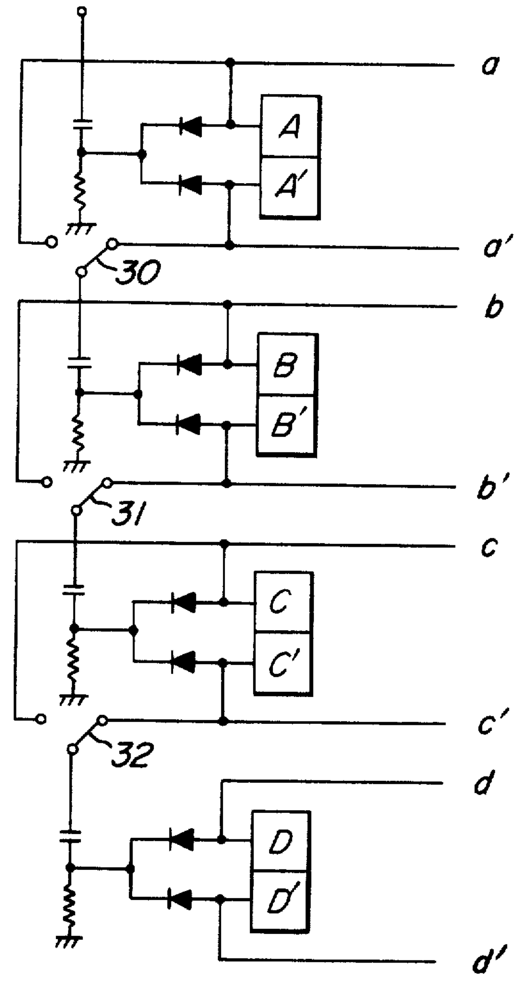
FIG. 4 shows in detail a part of the circuit shown in FIG. 1.

FIG. 4 shows a variation of a part of the circuit shown in FIG. 1. In this figure, the boxes labeled A, A', B, B', C, C', D and D' correspond respectively to the flip-flops 15 to 18 as shown in FIG. 1, while the letters *a*, *a'*, *b*, *b'*, *c*, *c'*, *d* and *d'* designate the terminals connected to the rows of the matrix. By changing over the switches 30, 31 and 32, the same operation as described with the circuit shown in FIG. 1 is followed, the forward or reverse channel change-over being able to be effected.

Needless to say, the number of channels to be selected can be increased by increasing the number of stages of the binary counters, i.e., flip-flops, or by the application of negative feedback, and the matrix circuit need not be limited to a diode matrix but may be any matrix which can convert binary codes into corresponding *n* outputs (i.e., *n* output codes).

A group of pilot lamps 34 shown in FIG. 1 serve to indicate the channels selected and may consist of neon lamps and the like display devices.

As described above, according to this embodiment, the tuner and its control circuit are constituted of electronic components so that the resultant completely electronic channel selector which uses variable capacitance diodes as tuning elements, is free from any mechanical faults. Further, with this selector, the sequential change-over of channels in either forward or reverse direction is performed without any complicated mechanism so that it is especially useful as the channel selector of a television receiver to facilitate channel selecting operation.

Figure 5:
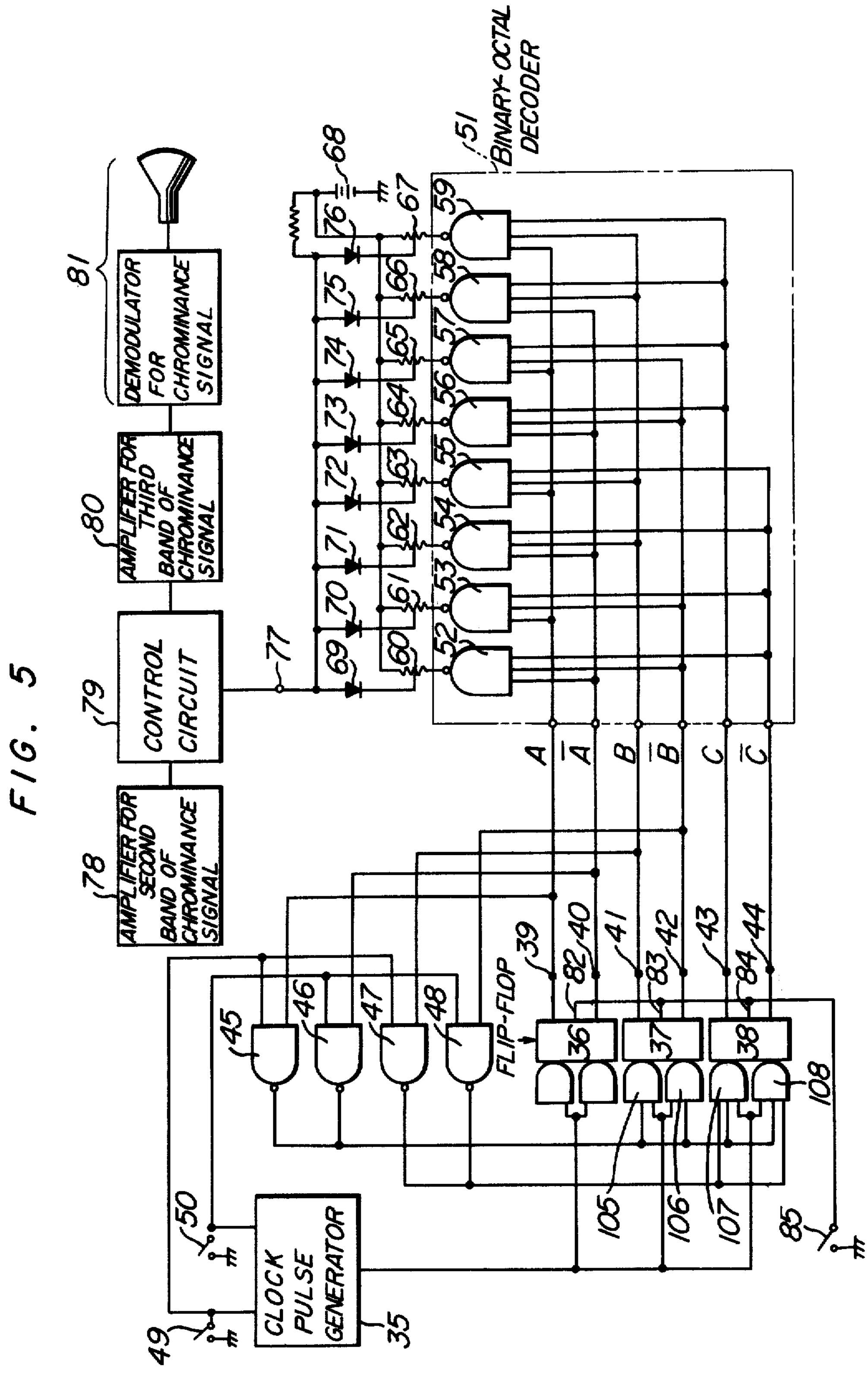
FIG. 5 is a circuit diagram of a remote control device as a second embodiment of the present invention.

Next, a description will be made of how the saturation of color in a color television system is controlled remotely. Reference will now be made to FIG. 5. Reference numeral 35 designates a clock pulse generator, and 36, 37 and 38 flip-flops, which have their output terminals 39, 40; 41, 42 and 43, 44, respectively. A NAND gate 45 has two input terminals connected respectively with a switch 49 and the output terminal 39 of the flip-flop 36, a NAND gate 46 has two input terminals connected respectively with a switch 50 and the output terminal 40 of the flip-flop 36, a NAND gate 47 has two input terminals connected respectively with the switch 49 and the output terminal 41 of the flip-flop 37, and a NAND gate 48 has two input terminals connected respectively with the switch 50 and the output terminal 42 of the flip-flop 37. The circuit constituted of the components just mentioned is a reversible counter circuit controlled by the switches 49 and 50, which also control the clock pulse generator 35. The reversible counter is an equivalent to the circuit shown in FIG. 4. The input terminals of the NAND gate 45 receive respectively the signal from the switch 49 and the signal from the output terminal 39 of the flip-flop 36 while the NAND gate 46 receives the signal from the switch 50 and the signal from the output terminal 40 of the flip-flop 36. When the switch 49 is closed, a low level voltage L is applied to the NAND gate 45, while a high level voltage H is applied to the NAND gate 45 when the switch 49 is open. The same is true if the NAND gate 46 and the switch 50 are considered.

Now, provided that only the switch 49 is closed, then the NAND gate 45 delivers no output regardless of whether the output terminals give a level L or H. In this case, the terminal of the NAND gate 46, connected with the switch 50 is kept at the level H so that the level opposite to that developed at the terminals 39 and 40 is delivered. This output level together with the output from the clock pulse generator 35 is applied to AND gates 105 and 106, and the outputs of the AND gates 105 and 106, if existing, invert the flipflop 37. The NAND gates 47 and 48 operate in a similar manner and control AND gates 107 and 108. Every time a pulse arrives from the clock pulse generator 35, the state of each of the flip-flops 36, 37 and 38 is inverted. If the switch 49 is opened with the switch 50 closed, the change of states of the flip-flops 36, 37 and 38 takes place in the reverse manner. The switches 49 and 50 are provided with long lead wires so as to be remotely controlled. The switches 49 and 50 may also be incorporated in a television receiver. In this case, the switches are so designed to be controlled by a supersonic or light signal produced by a watcher who is situated at some distance from the television set.

The reversible counter described above transmits a signal in binary code to a binary-octal decoder 51 consisting of NAND gates 52 to 59. The output terminals of the flip-flops 36, 37 and 38 are connected respectively with the input terminal A, $\overline{A}$, B, $\overline{B}$, C, and $\overline{C}$. With this constitution, $\overline{A}$ is kept at low level L if A is kept at high level H while $\overline{A}$ is kept at high level H if A is kept low. Namely, the levels applied to A and $\overline{A}$ are always opposite to each other, and such a condition is also true for terminal pairs B and $\overline{B}$, C and $\overline{C}$.

Numeral 78 designates an amplifier for the second band of chrominance signal of the color television system; 79 a control circuit whose amplification factor varies in response to the voltage appearing at a terminal 77 and which can control the amplitude of the chrominance signal, 80 an amplifier for the third band of the chrominance signal, and 81 a demodulator for the chrominance signal, which is a reproducing device including a picture tube.

It is assumed that each of the digits of A, $\overline{A}$; B, $\overline{B}$ and C, $\overline{C}$ is zero if the low levels L are applied to the terminals A, B and C while the high levels H are applied to the terminals $\bar{A}$, $\bar{B}$ and $\bar{C}$ and that each of the digits of A,$\bar{A}$; B,$\bar{B}$ and C,$\bar{C}$ is 1 if the low and high level are interchanged. It is further assumed that when the NAND gates in the decoder 51 deliver outputs of level L current flows through loads connected with the corresponding outputs of the NAND gates while no current flows through the loads if the outputs of the NAND gates are of H and that the voltage dividing ratio of each of resistors 60 to 67 is so determined as to cause a desired voltage to appear at the terminal 77. With these assumptions it is concluded as follows. Namely, if the binary outputs of the reversible counter are applied to the groups of terminals A, $\bar{A}$; B, $\bar{B}$; and Ç, $\bar{C}$, then current flows through the load connected with one of the NAND gates 52 to 59 corresponding to the binary coded output so that a corresponding desired voltage at the tap of the load appear at the terminal 77. Therefore, if the switch 49 or 50 is closed to operate the reversible counter, the control voltage applied to the control circuit 79 changes successively.

The reversible counter is stopped by opening the switch 49 or 50 when the chromatic saturation of the reproducing device 81 reaches the optimum value, and to the control circuit 79 continue to be applied with the divided voltage developed across the load of the NAND circuit corresponding to the binary number stored in the flip-flops of the reversible counter. Therefore, the television receiver continues to operate with the optinum value of chromatic saturation. Reference numerals 82, 83 and 84 are the reset terminals of the flip-flops 36, 37 and 38. In a usual counter circuit, the binary output of the circuit is 000 or 111 when it is reset. However, in this case, the reversible counter is reset in such a manner that a binary number may be delivered which makes it possible to select the gate having a voltage-dividing resistor as its load whose resistance is so determined as to cause the chromatic saturation to reach the optimum value. Namely, the counter is reset under the condition described above. For example, in case where the chromatic saturation assumes the optimum value when the output of the NAND gate 55 is at the low level L, the counter circuit should be reset when the digits of A, $\bar{A}$; B, $\bar{B}$ and C, $\bar{C}$ are respectively 1, 1 and 0, that is, the output of the counter is 110. It depends on the design of flip-flops whether they are reset under the condition 0 or 1. A switch 85 controls the reset terminals 82, 83 and 84, and is closed when remote control needs to be stopped to determine the value of chromatic saturation to be displayed.

Figure 10:
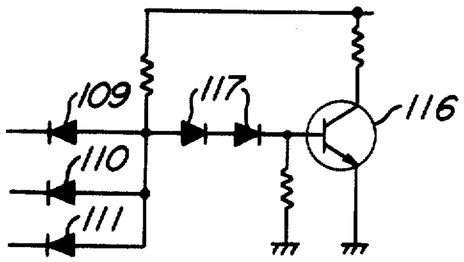
FIG. 10 shows in detail a part of the circuit shown in FIG. 5.

Each of the NAND gates 52 to 59 shown in FIG. 5, for example, comprises a circuit as shown in FIG. 10, wherein diodes 109, 110, 111 correspond to the diode 112, 113, 114 and 115. In the circuit shown in FIG. 1, the case is described where 8 × 4 diodes are used and the circuit, as in FIG. 10, comprising a transistor 116 and a diode 117 is not used.

In the foregoing, a reversible three-bit counter circuit comprising eight NAND gates is described and it is needless to say that a circuit having NAND gates more or less than eight can also be used.

With the constitution described above, the control switch 85 has only to be closed in order to release the control of chromatic saturation from remote control and in that case the chromatic saturation takes the preset optimum value. If the preset saturation value is not desirable, a desirable saturation value is obtained by merely manipulating the potentiometers 60 to 67. Thus, anyone who has not the knowledge of the expert in the field of the art, can enjoy free selection of chromatic saturation by merely operating a remote control unit or potentiometers.

Figure 6:
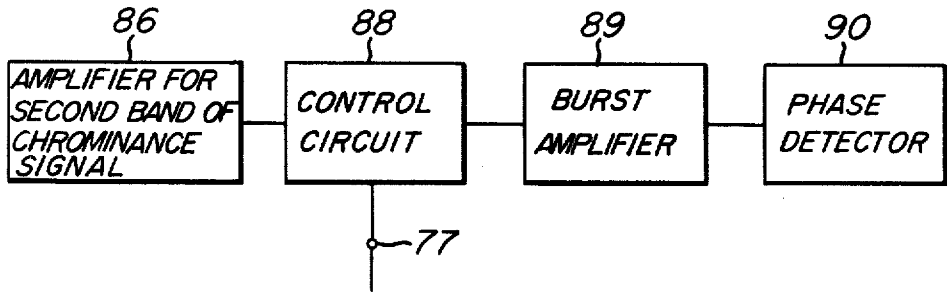
FIGS. 6 to 9 are schematic block diagrams of parts of the remote control device shown in FIG. 5, the parts being alternative forms embodying the present invention.

FIG. 6 shows an amplifier 86 for the second band of chrominance signal, a control circuit 88 which includes elements whose inductances or capacitances are varied in response to the voltage appearing at the terminal 77 (the same as the terminal 77 shown in FIG. 5) and which controls the phase of the burst signal from the amplifier 86, a burst amplifier 89, and a phase detector 90. By applying the voltage appearing at the terminal 77 in FIG. 5 to the amplifier 88 as seen in FIG. 6, the hue control of a color television receiver can be performed. In the control circuit 88, either a variable capacitance diode is used to change capacitance or a device is used which has a coil with core of magnetic substance whose permeability is varied according to the variation in the current through the coil, so as to change the inductance. In this case, also, the optimum hue is selected when remote control is released by means of the switch 85.

Figure 7:
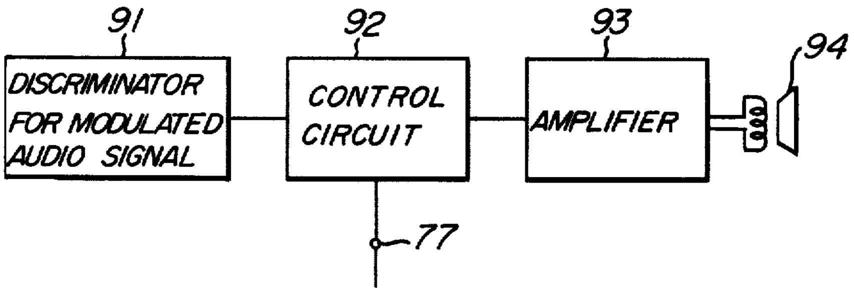
Figure 8:
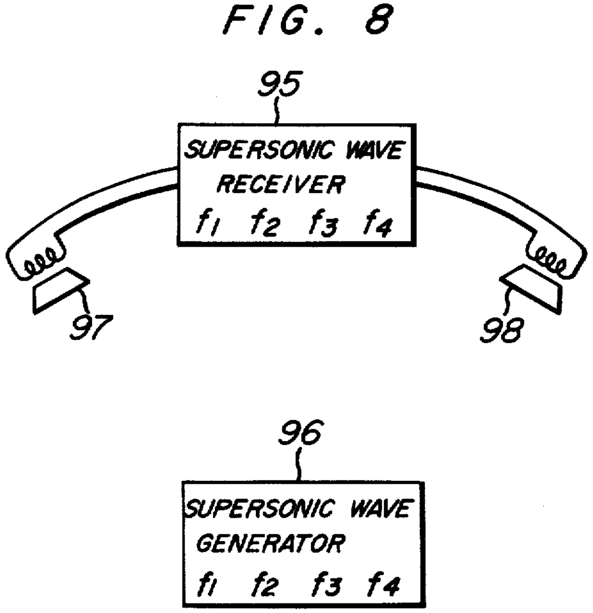

Further, by applying the voltage appearing at the terminal 77 in FIG. 5 to a control circuit 92 as shown in FIG. 7, the control of sound in the color television receiver can be performed. FIG. 7 shows a discriminator 91 for modulated sound signal, an amplifier 93, a speaker 94 and the control circuit 92 which controls the quantity of the output of the amplifier 91 and which may be so designed as to control the gain of the amplifier with the voltage at the terminal 77.

Figure 9:
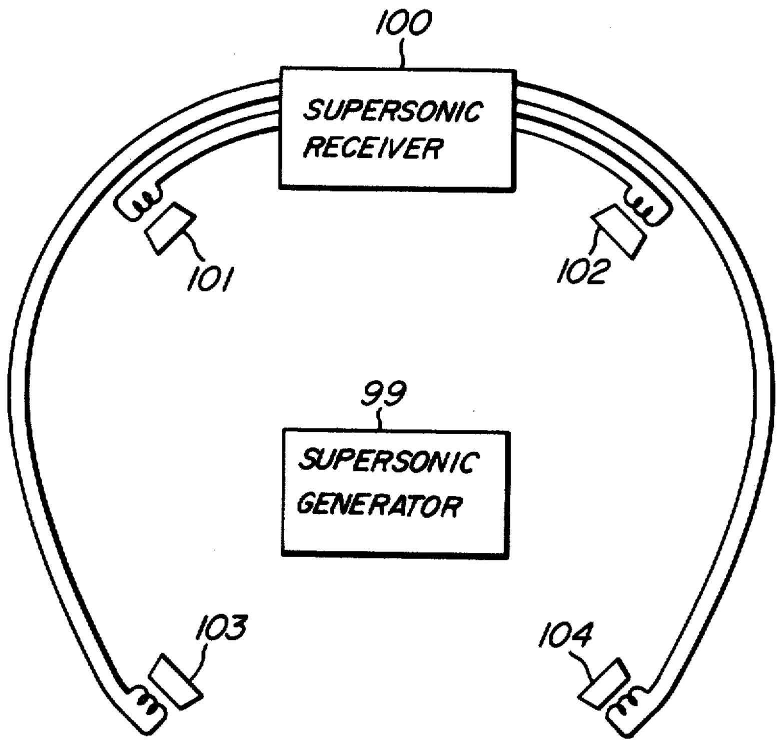

Moreover, if a pair of such devices as shown in FIG. 7 which can adjust the volume of sound, are provided in a stereophonic system, then the system can be balanced by means of supersonic signal. In FIG. 9, reference numerals 97 and 98 designate speakers, 95 a supersonic wave receiver, and 96 a supersonic wave generator. A listener who is located at the supersonic generator, transmits a supersonic signal to the receiver 95 and controls the volume of sound from the speakers 97 and 98. A supersonic wave having a frequency of $f_1$ emitted from the generator 96 is received by the receiver 95 and converted to an electric signal to close the switch 49 of the device which controls the volume of sound from, for example, the speaker 97. In like manner, supersonic wave having a frequency of $f_2$ serves to close the switch 50 while supersonic waves having frequencies of $f_3$ and $f_4$ serve to respectively close the switches 49 and 50. This supersonic control may be substituted by wire control.

Furthermore, according to the present invention, a four-channel stereophonic system can be effectively controlled. For such a purpose, however, there need to be four circuits each of which has the construction shown in FIG. 7. FIG. 9 shows the state of arranging constituents necessary for this purpose. In this figure, numeral 99 designates a supersonic generator, 100 a supersonic receiver, and 101, 102, 103 and 104 speakers.

I claim:

1. A remote control device comprising a reversible binary counter whose operation can be remotely controlled;

a binary to *n* output decoder having a plurality of binary input terminals coupled to corresponding outputs of said reversible counter and a plurality of *n* output terminals, one of said output terminals being selected in correspondence with a binary output signal from said counter;

a plurality of preset elements connected respectively with said plurality of $n$ output terminals, each of said preset elements comprising variable resistors connected respectively to said plurality of $n$ output terminals to produce a predetermined control voltage at said selected one of said output terminals;

a device whose operation is controlled by said control voltage obtained from said selected output; and means for remotely controlling said reversible binary counter.

2. The remove control device according to claim 1, further comprising: means for resetting said reversible binary counter to a predetermined value corresponding to an optimum operation value of said voltage controlled device.

3. A remote control device according to claim 2, wherein said device to be controlled by said control voltage is the hue control circuit of a color television receiver and the phase of a burst signal in said hue control circuit is controlled by said control voltage.

4. A remote control device according to claim 2, wherein said device to be controlled is the chromatic saturation control circuit of a color television receiver and the amplitude of a chrominance signal is controlled by said control voltage.

5. A remote control device according to claim 2, wherein said device to be controlled is an audio circuit and the volume of said audio circuit is controlled by said control voltage.

6. A remote control device according to claim 2, wherein said device to be controlled consists of a pair of audio circuits in a stereophonic system and wherein a reversible binary counter and a circuit for deriving said predetermined voltage are further provided to produce two control signals which control the volumes of said pair of audio circuits.

7. A remote control device according to claim 2, wherein said device to be controlled consists of four audio circuits of a four-channel stereophonic system and wherein three reversible binary counters and three circuits for deriving said predetermined voltage are further provided to produce four control signals which control the volumes of said four audio circuits.

* * * * *